(12) United States Patent
Kuppuswamy et al.

(10) Patent No.: US 7,286,968 B2
(45) Date of Patent: Oct. 23, 2007

(54) METHOD OF DETECTING THE POSITION OF A WAVE FRONT IN A SIGNAL RECEIVED BY A DETECTOR

(75) Inventors: Raja Kuppuswamy, Paris (FR); Philip Moore, Frome (GB); Iliana Portugues, Glasgow (GB); Sebastien Louise, Courbevoie (FR)

(73) Assignee: Areva T&D SA, Paris (FR)

( * ) Notice: Subject to any disclaimer, the term of this patent is extended or adjusted under 35 U.S.C. 154(b) by 0 days.

(21) Appl. No.: 11/389,005

(22) Filed: Mar. 27, 2006

(65) Prior Publication Data
US 2006/0259281 A1 Nov. 16, 2006

(30) Foreign Application Priority Data
Mar. 29, 2005 (FR) .................................. 05 50799

(51) Int. Cl.
*G06F 15/00* (2006.01)
(52) U.S. Cl. ..................................... 702/189
(58) Field of Classification Search ................. 702/189
See application file for complete search history.

(56) References Cited

U.S. PATENT DOCUMENTS

| | | | |
|---|---|---|---|
| 3,887,871 A | 6/1975 | Aechter et al. | |
| 4,414,850 A | 11/1983 | Miwa et al. | |
| 6,137,438 A | 10/2000 | McEwan | |
| 6,314,055 B1 | 11/2001 | Foxlin et al. | |
| 6,708,023 B1 | 3/2004 | Pincenti et al. | |
| 2004/0246000 A1* | 12/2004 | Kuppuswamy | 324/536 |
| 2006/0018413 A1* | 1/2006 | Gupta | 375/343 |

OTHER PUBLICATIONS

B. T. Phung, et al. "Partial Discharge Ultrasonic Wave Propagation in Steel Transformer Tanks"; 7th International Symposium on High Voltage Engineering; Technische Universitat Dresde; Aug. 26-30, 1991; pp. 131-134.
Chrysostomos L. Nikias, et al., "Signal Processing with Higher-Order Spectra", IEEE Signal Processing Magazine, Jul. 1993, pp. 10-37.

(Continued)

*Primary Examiner*—John Barlow
*Assistant Examiner*—Demetrius R. Pretlow
(74) *Attorney, Agent, or Firm*—Oblon, Spivak, McClelland, Maier & Neustadt, P.C.

(57) ABSTRACT

This invention relates to a method for detection of a position of a wave front in a signal received by a detector. This method includes converting the signal into a digital signal, defining a working group of N successive samples in the digital signal, and processing at least some of the samples in the working group. Energy of the signal is calculated from the processed samples in the working group in terms of the root mean square over a sliding window, the window including an optimum number Lopt of samples (Lopt is less than N). Also included is detecting the position of the wave front corresponding to the position of the sample for which the energy of the signal exceeds a threshold D that depends on the value of the energy of the signal previously at the wave front, for the first time.

21 Claims, 12 Drawing Sheets

OTHER PUBLICATIONS

Chrysostomos L. Nikias, et al., Higher-Order Spectra Analysis A Nonlinear Signal Processing Framework, PTR Prentice Hall, pp. V-XV.

Jerry M. Mendel, "Tutorial on Higher-Order Statistics (Spectra) in Signal Processing and System Theory: Theoretical Results and Some Applications", Proceedings of the IEEE, vol. 79, No. 3, Mar. 1991, pp. 277-305.

Chrysostomos L. Nikias, "Time Delay Estimation In Unknown Gaussian Spatially Correlated Noise", IEEE Transactions on Acoustics, Speech, and Signal Processing, vol. 36, No. 11, Nov. 1988, pp. 1706-1714.

Hsing-Hsing Chiang, et al., "A New Method for Adaptive Time Delay Estimation for Non-Gaussian Signals", IEEE Transactions on Acoustics, Speech, and Signal Processing, vol. 38, No. 2, Feb. 1990, pp. 209-219.

Ananthram Swami, et al., "Cumulant-Based Approach to the Harmonic Retrieval and Related Problems", IEEE Transactions on Acoustics, Speech, and Signal Processing, vol. 39, No. 5, May 1991, pp. 1099-1109.

* cited by examiner

| Détecteur | Position front d'onde | |
| --- | --- | --- |
| | Visuelle | Procédé |
| Ch 2 | -69,8 µs | -55,6 µs |
| Ch 3 | -80,1 µs | -94,8 µs |
| Ch 4 | 251,0 µs | 210 µs |
| Ch 5 | 225,0 µs | 228,0 µs |
| Ch 6 | 240,0 µs | 218,0 µs |

METHOD OF DETECTING THE POSITION OF A WAVE FRONT IN A SIGNAL RECEIVED BY A DETECTOR

TECHNICAL DOMAIN

This invention relates to a method of detecting the position of a wave front in a signal received by a detector. The signal may for example be an acoustic signal or an electromagnetic signal such as a radioelectric signal.

This invention can be used particularly in methods of detecting and positioning partial discharge sources in an electrical equipment such as a power transformer. Partial discharges in a transformer are associated with the emission of an acoustic signal (usually ultrasonic). Therefore, the wave front in the acoustic signal materializes the appearance of the partial discharge. A wave front means the forward part of the wave located between the virtual zero point and the peak value.

This application to electrical equipment is not limitative, and many other applications could be concerned for example in the field of sonar, or positioning of a voice source in a space.

STATE OF PRIOR ART

At the present time, the response time of an acoustic detector, in other words the time that elapses between when a wave front is emitted and when it is detected by the detector is estimated by mathematical cross-correlation techniques in the time domain or in the frequency domain. Documents [1] to [6], for which the references are given at the end of this description, contain explanations on these techniques. These techniques are not suitable when the acoustic source is located in a noisy environment in which signal echoes can occur and in which the acoustic signal can propagate as far as the detector along different paths. This is the case for power transformers because the windings are located in a containment full of an acoustically conducting dielectric fluid such as oil, and reflections can occur on the walls of the containment.

In the field of positioning a partial discharge source, document [7] in particular, for which the references are given at the end of the description, describes how to electrically detect the time at which a partial discharge appears and to visually acquire the arrival time of the associated wave front at a detector fixed on the outside wall of the containment. This is done based on a linear propagation of the acoustic signal and on a known velocity that depends on the dielectric environment. The distance between the detector and the partial discharge source can be calculated. The detector can be displaced at several locations in the containment, to deduce the position of the partial discharge source by triangulation.

In a second method, at least one pair of acoustic detectors is used simultaneously and the difference in time taken for an acoustic wave to travel the distance between the partial discharge source and each of the detectors in the pair is calculated. The arrival times of the wave front at each of the acoustic detectors are determined visually. If the positions of the acoustic detectors are known, a first hyperboloid is defined on which the partial discharge source is located. A second hyperboloid is defined in the same way, using another pair of acoustic detectors or moving the first pair of detectors, and the partial discharge source is located at the intersection between the two hyperboloids. Other methods derived from the previous methods are also known. In all of these methods, all that is made is a visual estimate of the arrival time of the wave front of the signal at each detector, in other words the position of the wave front in the signal received by the detector. Moreover in the second method, it is never certain that the signals detected by the two detectors originate from the same partial discharge source. In conclusion, there is a lack of precision in positioning of the partial discharge source and the partial discharge is not detected in real time because the calculations cannot be made until the arrival time of the wave front of the signal representing the partial discharge has been identified at the detector(s) being used.

PRESENTATION OF THE INVENTION

The purpose of this invention is to propose an automatic method for detection of the position of a wave front in a signal received by a detector. This method also can be used to eliminate the need for visual detection of the wave front and gives much more precise results.

To achieve this, this invention proposes to acquire the signal by the detector, to convert it into a digital signal to define a working group of N successive samples in the digital signal, and possibly to process the samples in the working group, to calculate the energy of the signal from the processed samples in the working group, if any, in terms of the root mean square over a sliding window, the window comprising an optimum number Lopt of samples (where Lopt is less than N), the position of the wave front corresponding to the position of the sample for which the energy of the signal exceeds a threshold D, that depends on the value of the energy of the signal previously at the wave front, for the first time.

The optimum number Lopt of samples in the window is determined by choosing an arbitrary number L' of samples, calculating the partial energy of the signal in terms of the root mean square within a range of the first P samples in the working group, the sliding window containing the said arbitrary number L' of samples, calculating the average of the partial energy of the signal in terms of the root mean square within the range of first P samples, calculating the standard deviation of the partial energy of the signal in terms of the root mean square within the range of the first P samples, calculating the ratio of the average to the standard deviation, the optimum number Lopt of samples in the sliding window corresponding to the minimum of this ratio or otherwise the maximum of this ratio.

The threshold D is a multiple r of the standard deviation plus the average in the range of the P first samples.

The definition of the working group consists of removing a subgroup of successive samples considered as being saturated, from a group of samples obtained by the analogue digital conversion.

A first sample $x(k)$ of the subgroup is considered as being saturated if this sample $x(k)$ and the subsequent three samples $x(k+1)$, $x(k+2)$, $x(k+3)$ satisfy the following relations:

$|x(k)-x(k+1)|>\epsilon$ and $|x(k+1)-x(k+2)|>\epsilon$ and $|x(k+2)-x(k+3)|>\epsilon$ and $|x(k)|>\theta$ where $\epsilon$ is the first floor and $\theta$ is the second floor, the subgroup comprising all samples in the group of samples obtained by the analogue conversion following the first sample considered as being saturated.

For example, we could choose $\epsilon=10^{-6}V$ and $\theta=1V$.

The processing may consist of filtering the samples so as to eliminate firstly a DC component and secondly to amplify samples at the highest frequencies.

This filtering can be done by a derivation.

The number P of samples in the range can be fixed equal to a fraction u of the position jc of a first sample for which the energy of the signal in the root mean square form is greater than a multiple q of the maximum energy of the signal in root mean square form over a range of an approximate number P' of first samples of the signal, where q and P' are chosen arbitrarily.

The fraction u may be chosen so as to be equal to 0.9.

This invention also relates to a method for determining the response time of at least one detector exposed to a signal comprising a wave front. It consists of detecting the wave front of the signal received by the detector according to the previous method and comparing the position detected at the detector with the position detected by the same method at another reference detector.

This invention also relates to a method for detection and positioning of a partial discharge source in an electrical equipment placed in a containment containing an acoustically conducting fluid. It consists of:

arranging several acoustic detectors in contact with the outside of the containment and acquiring their positions, forming one or several groups of detectors, these groups being triplets or quadruplets, detecting the position of a front of an acoustic wave transmitted by the partial discharge source using the method defined above for each detector in at least some groups, this position being representative of the reception time of the acoustic wave emitted by the partial discharge source, by each detector;

for at least some groups, calculating the position of the partial discharge source seen by these groups starting from the position of the acoustic detectors and the reception time of the acoustic wave emitted by the partial discharge source, by each detector.

The position of the partial discharge source seen from a group consisting of a triplet can be calculated by triangulation, by solving the following system of equations:

$$(x-xi)^2+(y-yi)^2+(z-zi)^2-v^2(ti-t0)^2=0$$

$$(x-xj)^2+(y-yj)^2+(z-zj)^2-v^2(tj-t0)^2=0$$

$$(x-xk)^3+(y-yk)^2+(z-zk)^2-v^2(tk-t0)=0 \text{ in}$$

which (x, y, z) denote the position of the partial discharge source, (xi, yi, zi), (xj, yj, zj), (xk, yk, zk) denote the position of the acoustic detectors of the triplet, t0 denotes an emission time of a partial discharge generated by the partial discharge source and ti, tj, tk are the reception times of the acoustic wave emitted by the partial discharge by each acoustic detector in the triplet, and v is the velocity of the acoustic wave in the fluid.

The emission time of the partial discharge may be measured by electrical means such as an antenna type electrical detector that cooperates with the containment.

The position of the partial discharge source seen from a group formed from a quadruplet can be calculated by triangulation, by solving the following system of equations:

$$\sqrt{(x-xj)^2+(y-yj)^2+(z-zj)^2}-\sqrt{(x-xi)^2+(y-yi)^2+(z-zi)^2}-v(tj-ti)=0$$

$$\sqrt{(x-xk)^2+(y-yk)^2+(z-zk)^2}-\sqrt{(x-xi)^2+(y-yi)^2+(z-zi)^2}-v(tk-ti)=0$$

$$\sqrt{(x-xl)^2+(y-yl)^2+(z-zl)^2}-\sqrt{(x-xi)^2+(y-yi)^2+(z-zi)^2}-v(tl-ti)=0$$

in which (x, y, z) represent the position of the partial discharge source, (xi, yi, zi), (xj, yj, zj), (xk, yk, zk), (xl, yl, zl) represent the position of the four acoustic detectors in the quadruplet, ti, tj, tk, tl are the reception times of the acoustic wave emitted by the partial discharge for each acoustic detector in the quadruplet, and v is the velocity of the acoustic wave in the fluid.

It is preferable to verify that the position found for the partial discharge source seen by a group is located inside the containment, otherwise the said position is eliminated.

The positioning precision can be improved by making a first verification before the calculation to assure that each group does not contain a triangle for which the vertices are materialized by three acoustic detectors and that comprises at least one angle outside a predetermined range of angles, and if there is such a triangle in the group, the group does not participate in the calculation.

To improve the positioning precision, it is preferable to make a second verification after the calculation to assure that each group not eliminated after the first verification does not contain a triangle for which the vertices are materialized by two of the detectors in the group and the position of the partial discharge source seen by the group, that comprises at least one angle outside the predetermined range, and if there is such a triangle in the group, the group is eliminated.

The range of angles may vary between 30° and 151° inclusive.

When several positions are obtained from several groups that have not been eliminated and these positions are located within the containment, an average of the positions of the partial discharge source calculated for each of the non-eliminated groups is calculated.

BRIEF DESCRIPTION OF THE FIGURES

The invention will be better understood after reading the following description of example embodiments given purely for information and in no way limitative, with reference to the appended figures, wherein.

Identical, similar or equivalent parts in the different figures are provided with the same numbers to facilitate comparing one figure with another.

The different parts represented in the figures are not necessarily drawn to the same scale, to make the figures more easily readable.

DETAILED PRESENTATION OF PARTICULAR EMBODIMENTS

Figure 9:
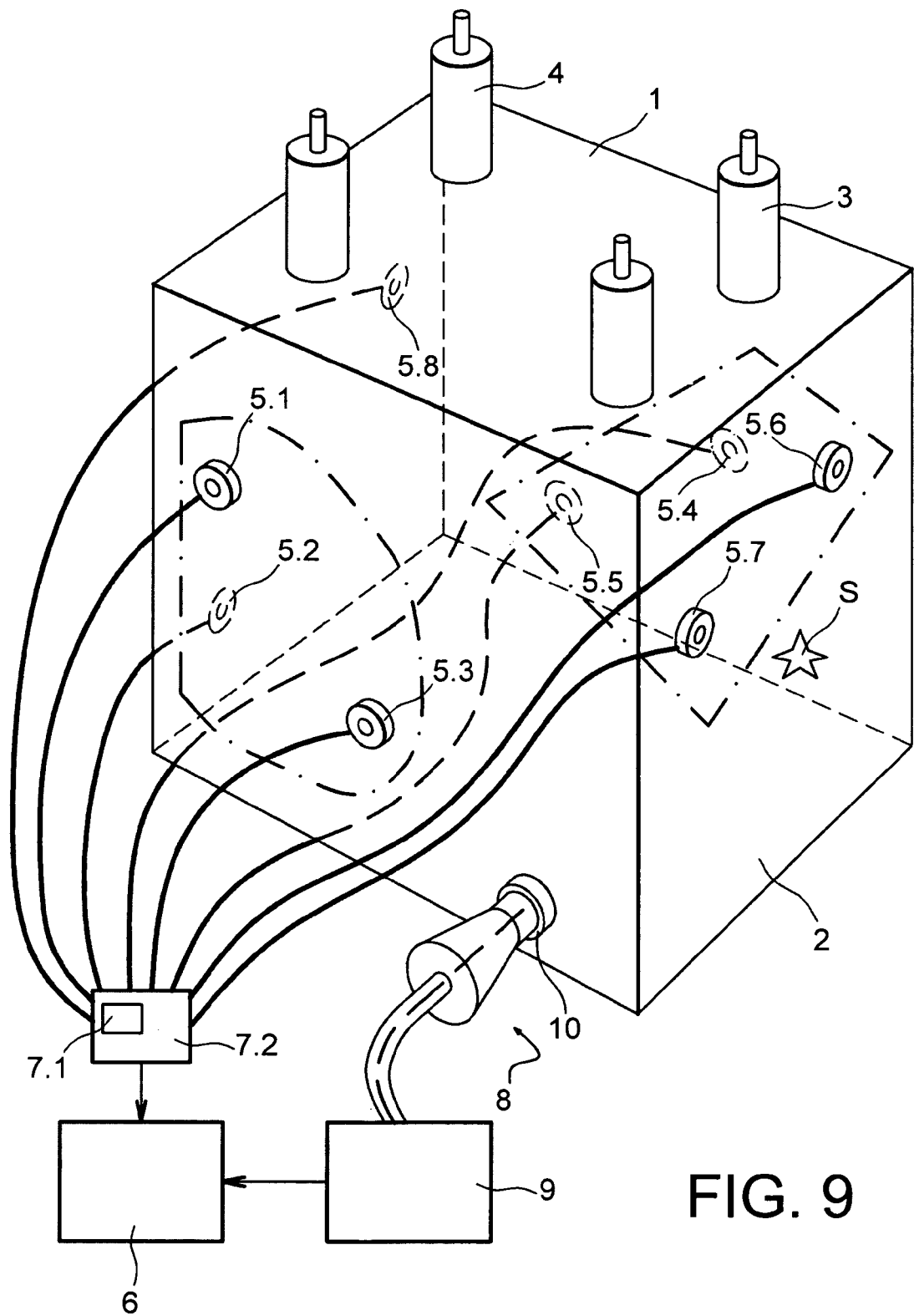
FIG. 9 shows a transformer equipped with equipment to detect and determine the position of a partial discharge source using the method according to the invention.

We will now describe the method for detecting the position of a wave front F in a signal acquired by a detector. In the example described, it is assumed that this signal is acoustic and that it originates from inside the containment of an electrical equipment, the wave front F representing the occurrence of a partial discharge at a partial discharge source. This electrical equipment, for example a power transformer, is placed inside a containment containing a conducting fluid. The detector is assumed to be placed in contact with the outside of the containment. Refer to FIG. 9 that diagrammatically shows such an equipment fitted with equipment to detect and determine the position of the partial discharge source S.

In other applications, the signal could be a voice signal and the detector could be a microphone if, for example, it is desired to detect the speech of a person in a room. In fact, problems in estimating the propagation time arise in many applications, for example determination of the range and the bearing of radar, tracking and positioning of radio electric sources, temperature measurements of molten alloys.

Figure 1A:
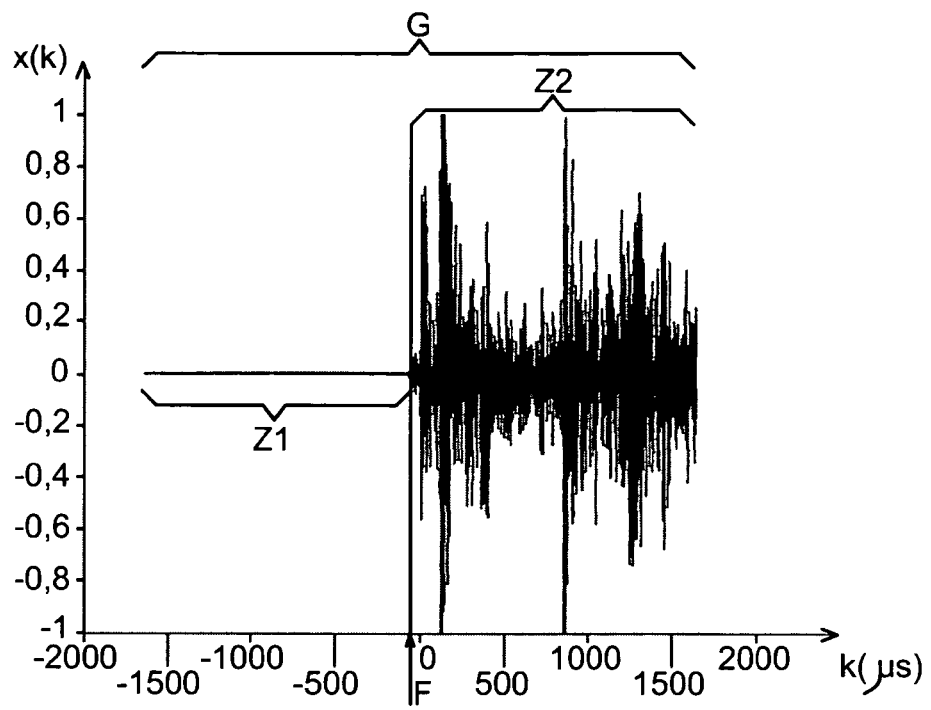
FIGS. 1A and 1B show the shape of the electrical signals output by two detectors placed within the same containment of an electrical equipment, after analogue-digital conversion.
Figure 1B:
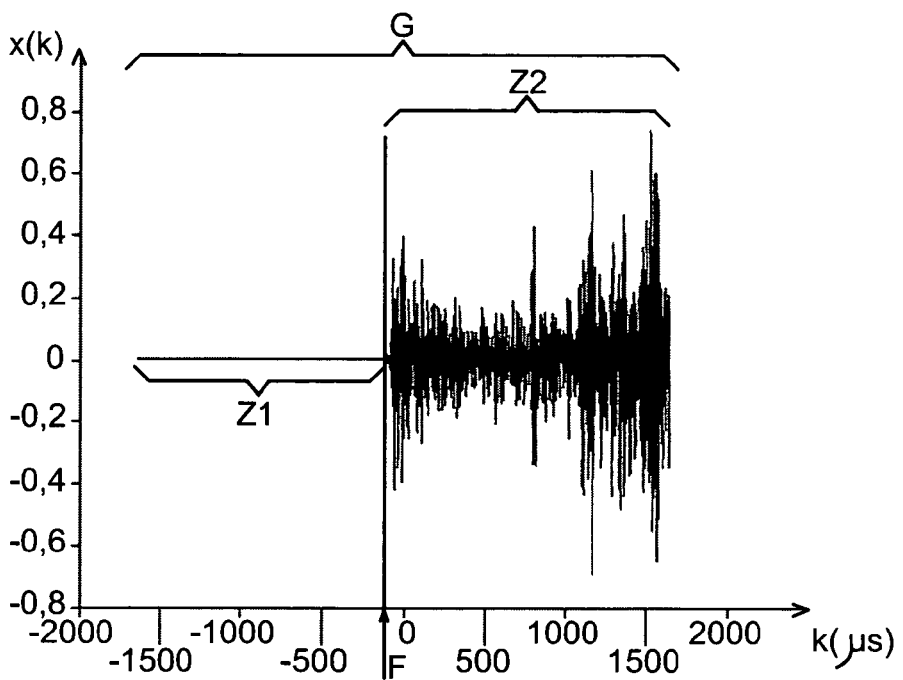
Figure 1C:
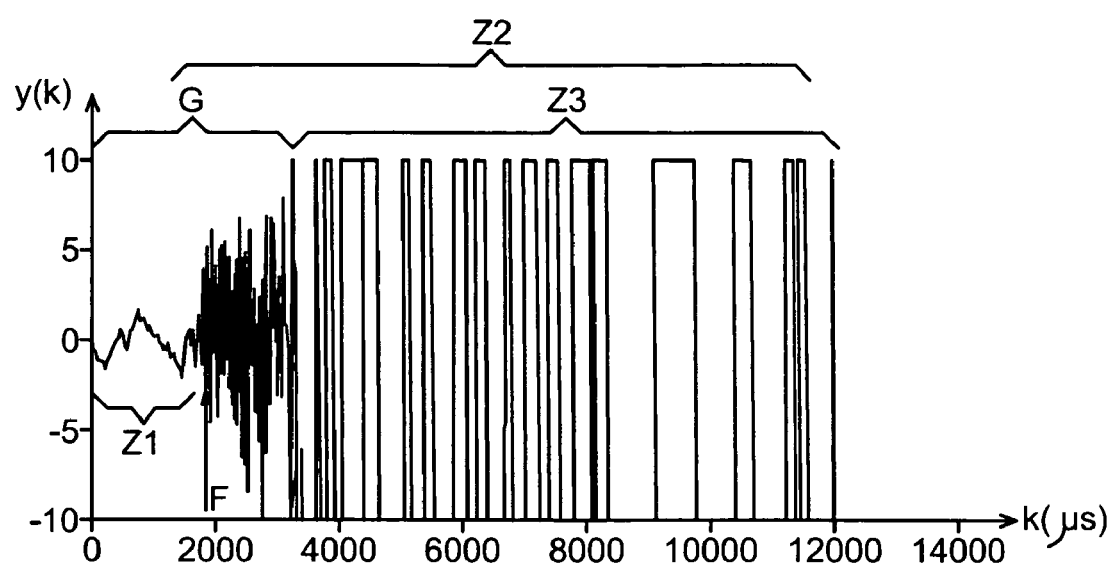
FIG. 1C shows a signal outputs by another detector of a different type from those used above comprising a saturated range in a different context.
Figure 8A:
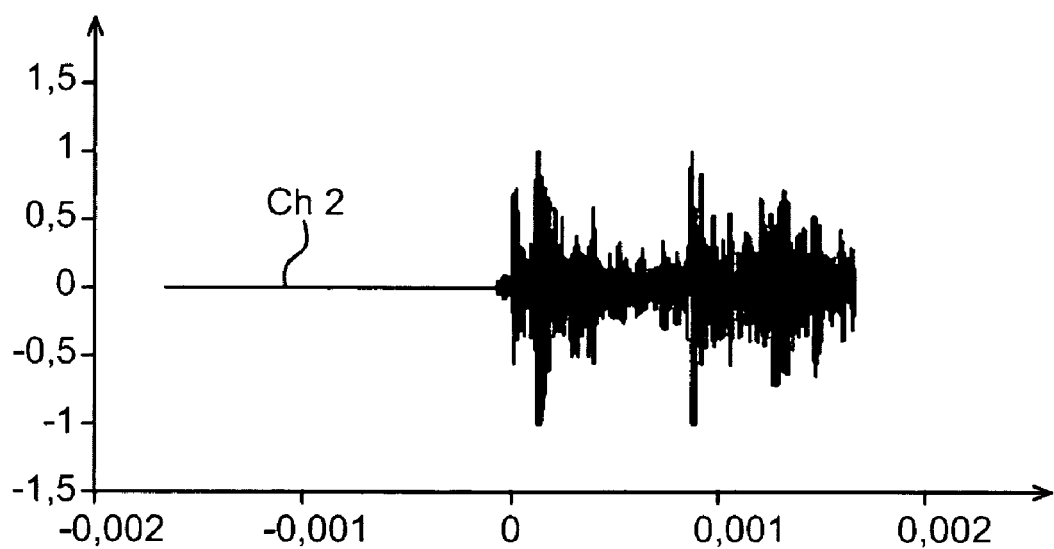
FIGS. 8A to 8F illustrate the shape of a signal output by 5 detectors Ch2 to Ch6 and the positions of the wave front determined by the method according to the invention and by visual observation.
Figure 8B:
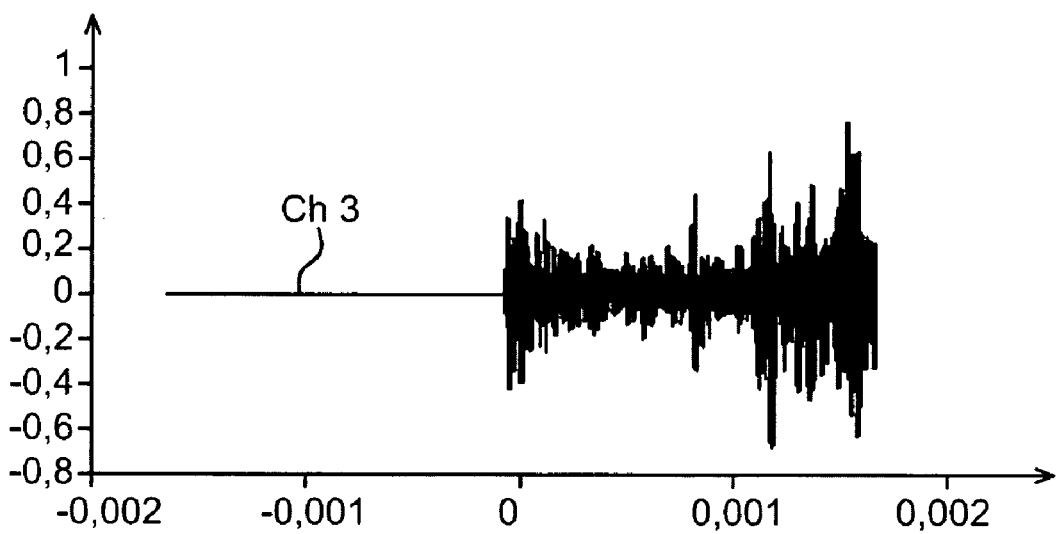
Figure 8C:
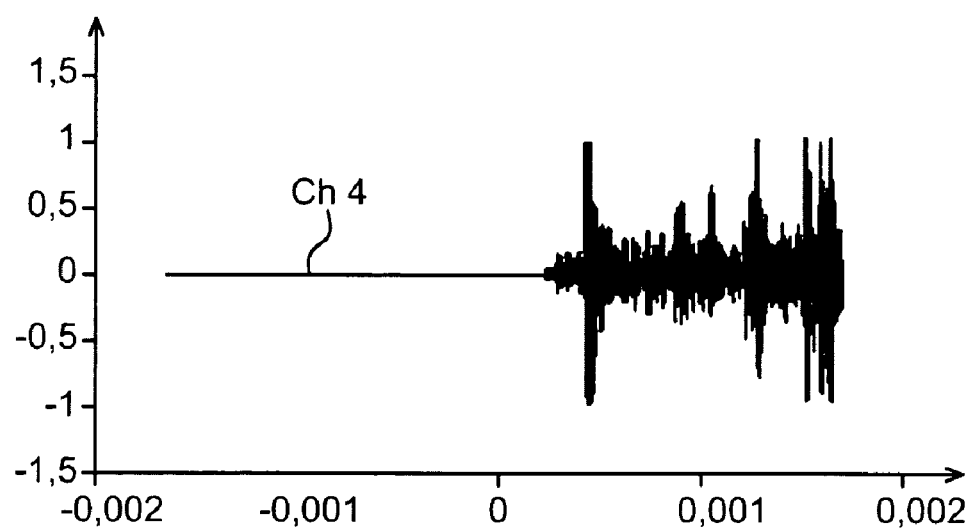
Figure 8D:
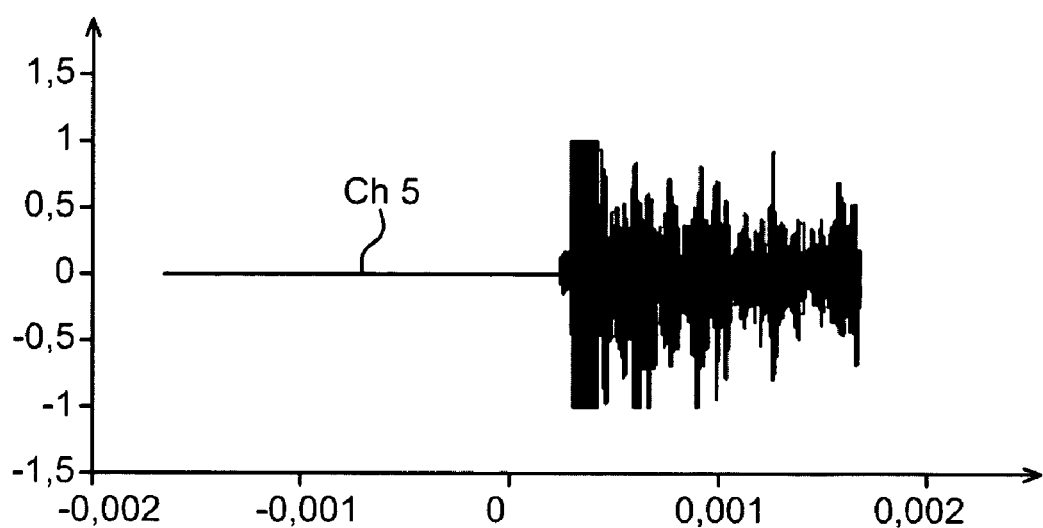
Figures 8E, 8F:
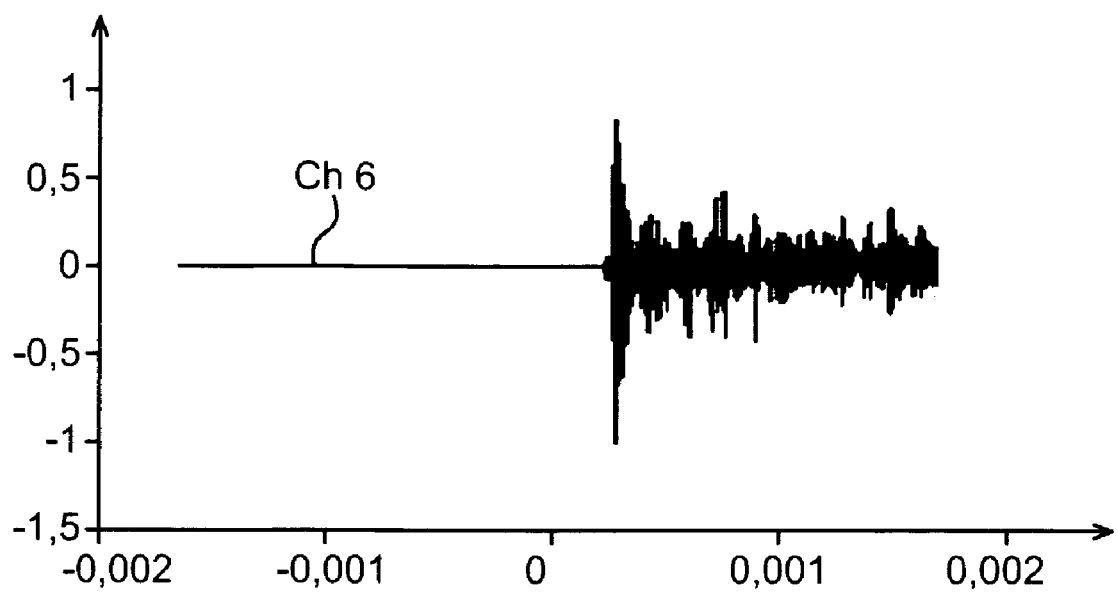

Refer to FIGS. 1A, 1B and 1C that show the shape of electrical signals output by detectors after an analogue-digital conversion. The signals in FIGS. 1A, 1B originate from two detectors of the same type placed at different locations and used during the same experiment. The origin of the signal that they detect is the same. Note that these two detectors correspond to detectors noted ch2 and ch3 respectively, for which the measurements are given in FIG. 8F. The signals in FIG. 1C originate from another type of detector operating in another context, but also placed in the containment of an electrical equipment. These signals are representative of the acoustic signal that they received from inside the containment. The signals in FIG. 1C are not recorded during the same test sequence as the signals in FIGS. 1A, 1B. The amplitude of these signals is approximately constant during a first range z1 prior to the arrival of the wave front F for which the position is to be detected. The amplitude of the signal when the wave front F arrives and after this arrival is very much greater than the amplitude of the signal in the first range z1. Thus, a second range z2 is determined on the downstream side of the wave front.

The shape of the digital signal is x(k), where k represents the successive samples in the digital signal. The number H of successive samples and therefore their position within this sequence are representative of time. It is assumed that the number of samples is equal to H and that $k \subset \{1, H\}$.

We will define a working group samples G for this signal x(k). This working group samples G extends both over the range z1 and the range z2. This working group of samples G may comprise H successive samples but very frequently it is better to reduce the number of samples to form the working group of samples G because some of the samples could distort the calculation intended to detect the position of the wave front.

This can arise if the digital signal x(k) includes a saturated part. This saturation may originate from the analogue digital conversion and it can disturb detection of the position of the wave front F. It is assumed that the signal x(k) in FIG. 1C comprises a saturated part z3 and that it does not include such a saturated part in FIGS. 1A, 1B.

This verification can be made by analyzing all samples successively starting from the first, so as to identify a first sample considered to be saturated. H samples are then removed, consisting of the saturated part z3 that is then formed from the first sample marked as being saturated and all the following samples.

To identify the first sample considered as being saturated, the first step is to check if a quadruplet of successive samples x(k), x(k+1), x(k+2), x(k+3) satisfies the following relations:

$$|x(k)-x(k+1)| > \epsilon \text{ and } |x(k+1)-x(k+2)| > \epsilon \text{ and}$$

$$|x(k+2)-x(k+3)| > \epsilon \text{ and } |x(k)| > \theta$$

where $\epsilon$ is the first floor and $\theta$ is the second floor, the first sample x(k) considered to be saturated being the first sample in the quadruplet x(k). The part of the signal z3 comprising all samples in the group that follow the first sample x(k) considered to be saturated is then eliminated. For example, we could choose $\epsilon = 10^{-6}$ Volt and $\theta = 1$ Volt.

It is preferable to process the digital signal x(k) free of saturation by filtering it so as to eliminate all DC components and to accentuate the amplitude of samples in the highest frequencies. This filtering may be done by a derivation.

The signal x(k) is processed by taking a sample and subtracting the previous sample. It becomes:

$$y(k) = x(k) - x(k-1)$$

Figure 2A:
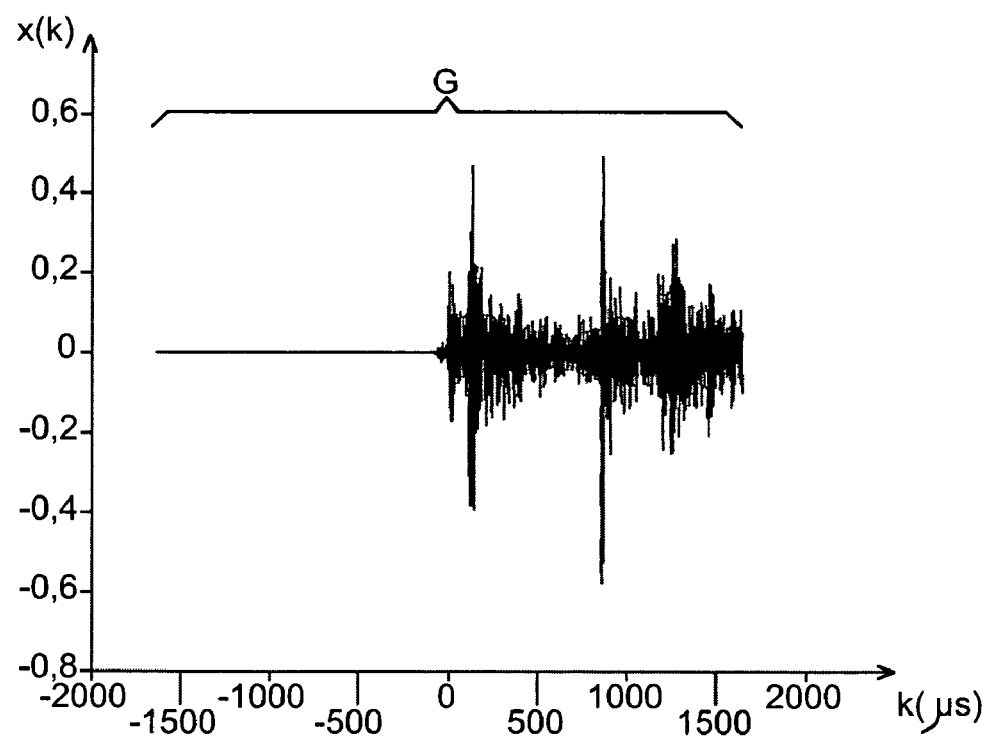
FIGS. 2A, 2B, 2C show working groups of samples of signals in FIGS. 1A, 1B and 1C respectively, after processing.
Figure 2B:
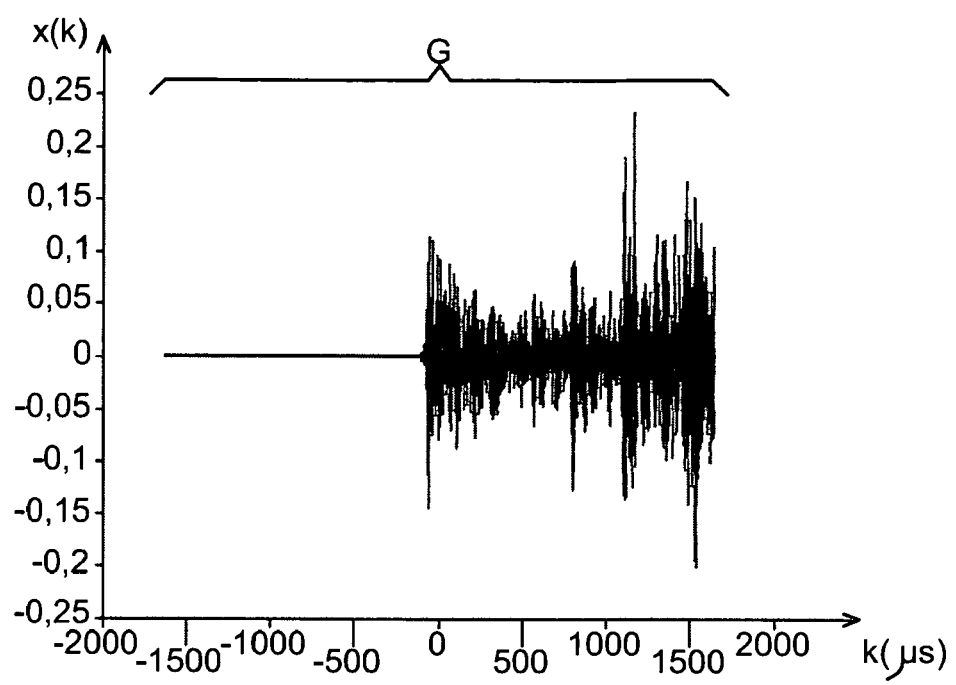
Figure 2C:
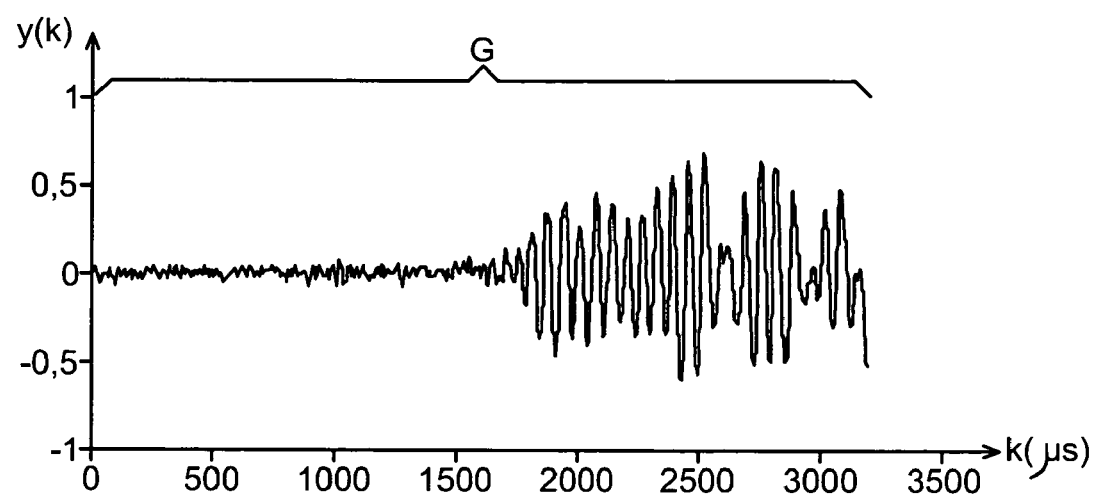
Figure 3:
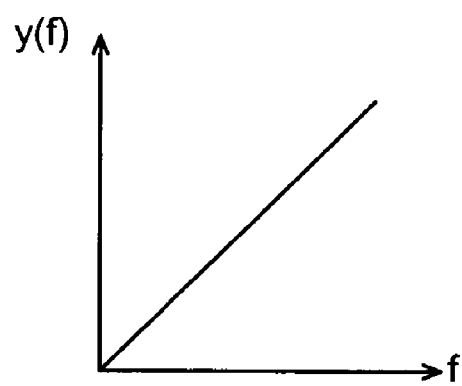
FIG. 3 shows the shape of the frequency response of a signal digitized after processing.

The frequency response of this type of filtered digital signal y(k) is shown in FIG. 3. This frequency response is linear and it passes through the origin at zero frequency. This linearity is advantageous in detection of the wave front, in an application for determining the position of a partial discharge in a transformer type electrical equipment, since waves with steep fronts contain a relatively large number of high frequencies, and these high frequencies are attenuated by the non-ideal propagation environment around the transformer, in other words the dielectric environment. Modification of the profile of frequencies makes this processing beneficial. FIGS. 2A, 2B, 2C show the shape of the signals in FIGS. 1A, 1B, 1C respectively, after filtering and elimination of saturated samples.

The N samples thus obtained form the working group of samples where $G = z1 + z2 - z3$. We will now calculate the energy of the signal in terms of the root mean square Srms(k) on a sliding window using an optimum width of samples Lopt, starting from samples in the working group G. This signal energy Srms(k) is a unipole signal. In the following, the energy of the signal in terms of the root mean square will simply be called the signal energy Srms(k).

The signal energy Srms(k) is calculated as follows:

$$Srms(k) = \sqrt{\sum_{i=0}^{Lopt-1} \frac{y(k+i)^2}{Lopt}}$$ (5)

Use of the sliding window with an optimum number Lopt of samples has a significant filtering effect on the digital signal y(k). If the number Lopt of samples is chosen correctly, in other words if it is optimum, the consequence of calculating the energy of the signal Srms(k) is to smooth the signal over the range z1 on the upstream side of the wave front F. It is then possible to precisely determine the position j of the wave front F by applying a threshold D to the energy of the signal Srms(k). This comparison with respect to the threshold D is possible since the energy of the signal SrmS(k) is a unipole signal. More particularly, the position j of the wave front F corresponds to the position of the first sample y(j) for which the amplitude exceeds the threshold D. j represents the rank of the sample, in other words its position in the sequence of samples, and this position is representative of a time and is expressed in time units. The threshold D depends on the value of the signal y(k) on the upstream side of the wave front F.

Therefore, an attempt is made to find the first sample j in the sequence of samples y(k), that satisfies the relation:

$$Srms(j) > D \quad (1)$$

where $D = r\sigma + \mu$. r is an integer or non-integer number chosen by the user, and $\mu$ represents the average of the energy of the signal Srms(k) and $\sigma$ the standard deviation of the energy of the signal Srms(k). r is chosen by experience.

Remember that the average $\mu$ is expressed as follows:

$$\mu = \frac{1}{N - Lopt} \sum_{i=1}^{N-Lopt} Smrs(i)$$

and that the standard deviation is expressed as follows:

$$\sigma = \sqrt{\frac{1}{N - Lopt - 1} \sum_{i=1}^{N-Lopt} (Srms(i) - \mu)^2}$$

The average $\mu$ and the standard deviation $\sigma$ are calculated on the N samples of the working group of samples G.

We will now see how to determine the value of the optimum width Lopt of the sliding window. We will start by choosing an approximate width L', where L' is typically between 5 and 100. This approximate width L' is used to calculate a partial energy of the signal Srms(k)' on a range of P samples of the signal, this range corresponds to the first P samples of the signal y(k) on the upstream side of the wave front F.

We will subsequently see how to precisely fix the number of samples P, in other words the width of the range.

$$Srms(k)' = \sqrt{\sum_{i=1}^{P-L'} \frac{y(k+i)^2}{P-L'}}$$

The result is P−L' values of the partial energy of the signal Srms(k)'. The average $\mu$' and the standard deviation $\sigma$' of the partial energy of the signal Srms(k)' can then be calculated within this range of P samples using the sliding window with an approximate width L'. This average $\mu$' and this standard deviation $\sigma$' are expressed as follows:

$$\mu' = \frac{1}{P-L'} \sum_{i=1}^{P-L'} Srms(i)'$$

and $$\sigma' = \sqrt{\frac{1}{P-L'-1} \sum_{i=1}^{P-L'} (Srms(i)' - \mu')^2}.$$

The ratio $\sigma'/\mu'$ can then be calculated. This ratio gives a measure of the smoothing of the partial energy of the signal Srms(k)'.

The optimum value Lopt of the width of the window is the value that corresponds to the minimum of the ratio $\sigma'/\mu'$. If the shape of the signal y(k) is such that there is no minimum value of the ratio $\sigma'/\mu'$, the optimum value Lopt of the width of the window corresponds to the maximum value of the ratio $\sigma'/\mu'$. For applications to determine the position of a partial discharge source in an electrical equipment such as a transformer, Lopt is usually between 5 and 100.

Figure 4A:
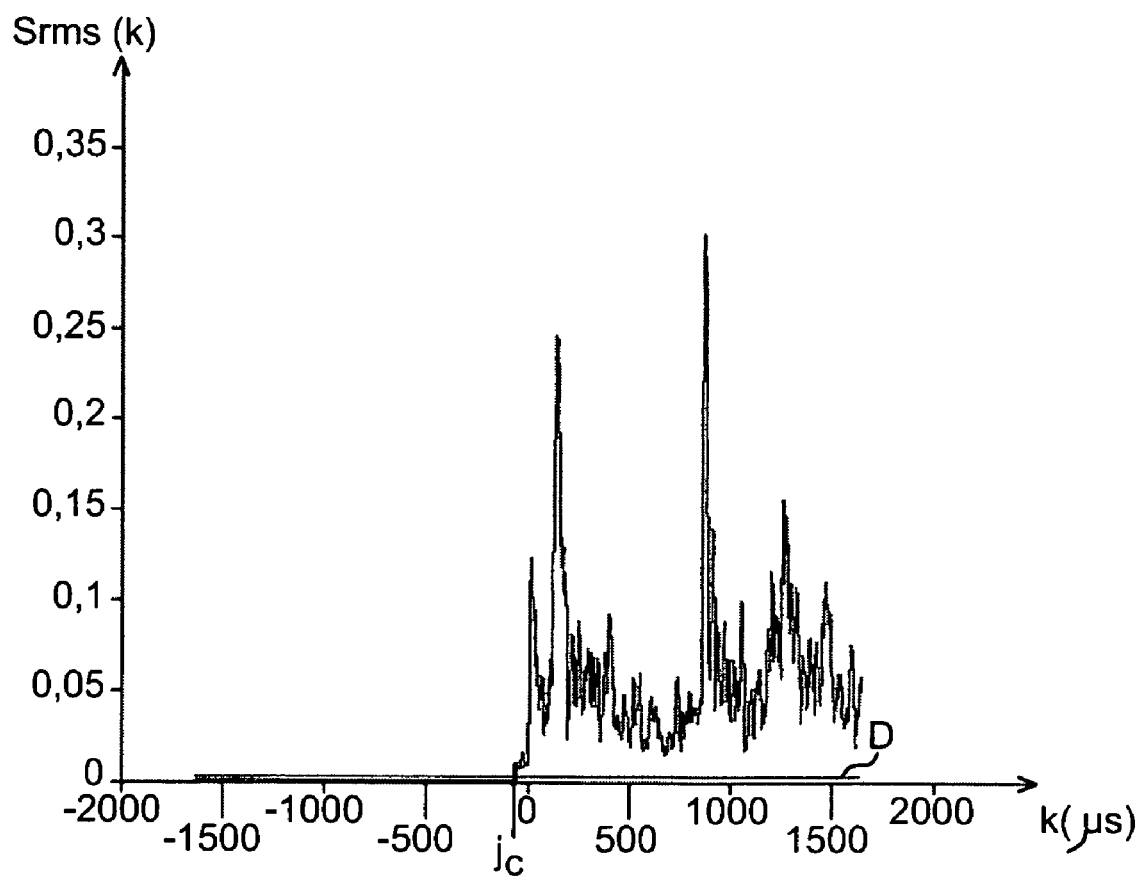
FIGS. 4A, 4B show the energies of the signals in FIGS. 2A and 2B, in terms of the root mean square and the position of the wave front.
Figure 4B:
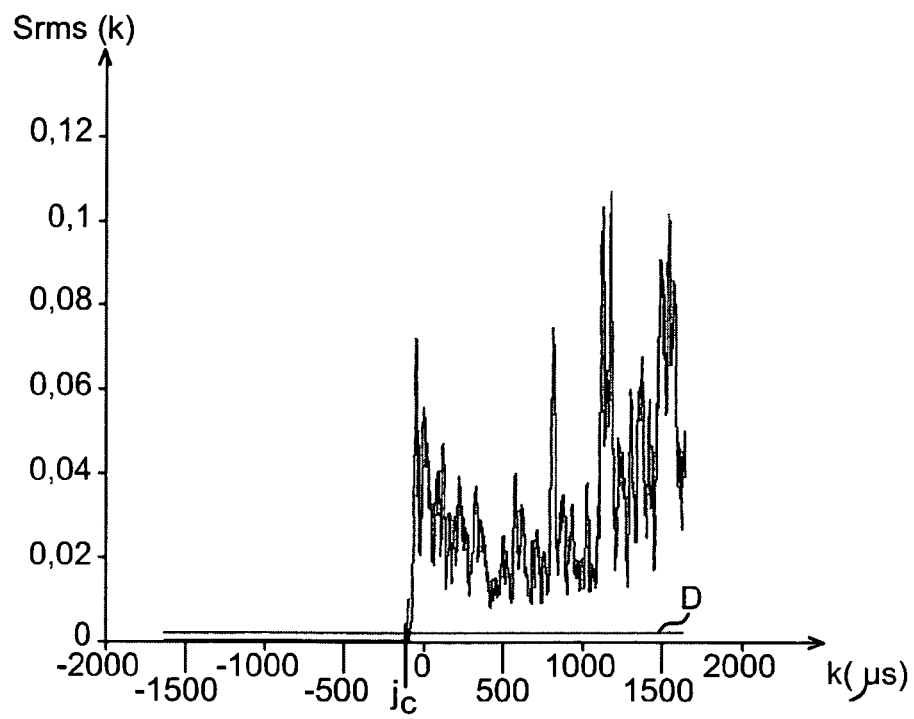
Figure 5A:
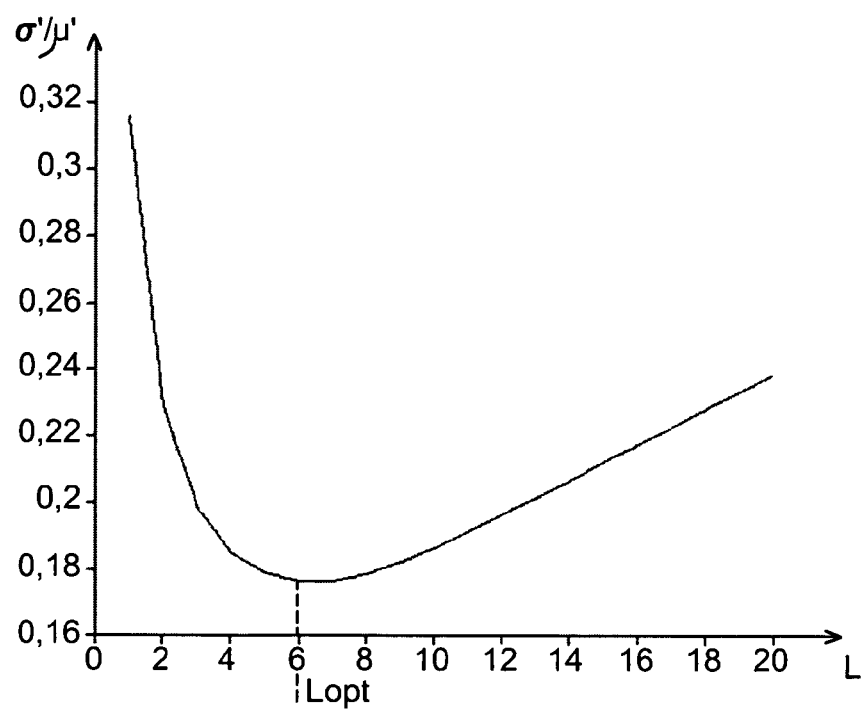
FIGS. 5A, 5B show the ratios of the standard deviation to the average of partial energies of signals in FIGS. 2A, 2B.
Figure 5B:
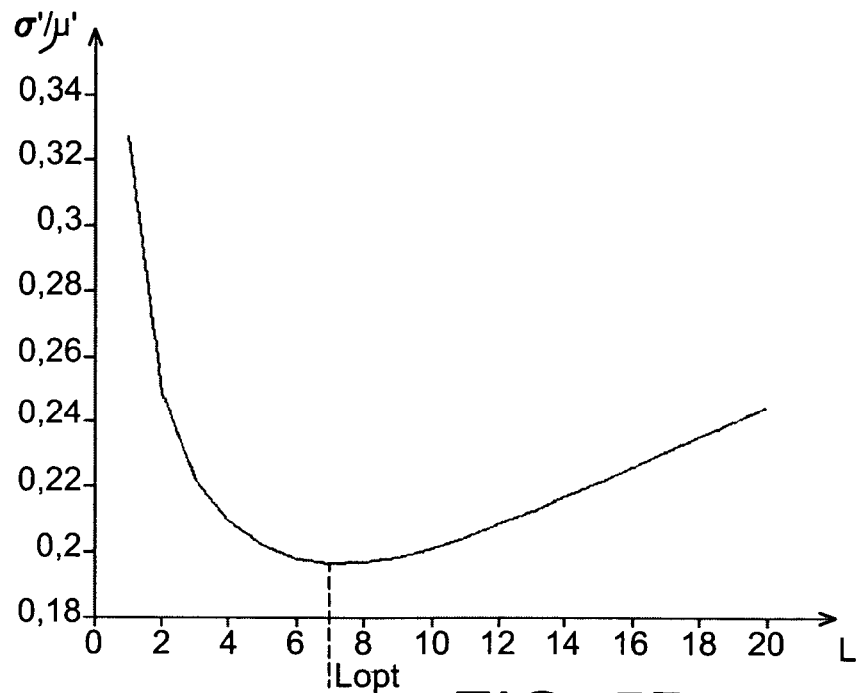
Figure 6A:
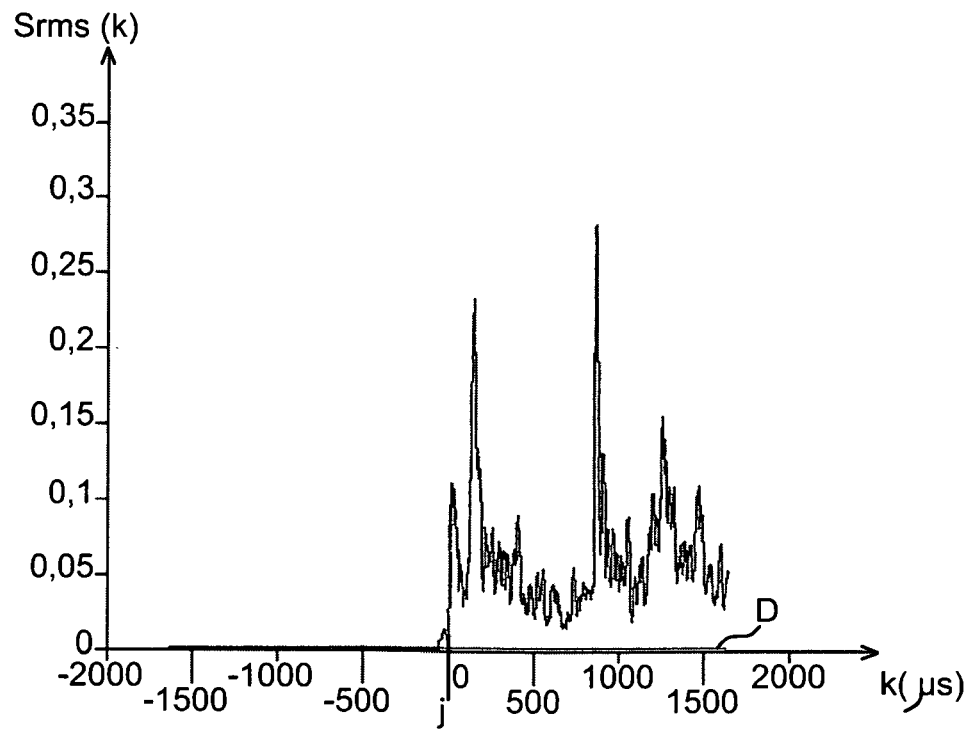
FIGS. 6A and 6B show the root mean square energy of the signal in FIGS. 2A and 2B respectively during a second pass.
Figure 6B:
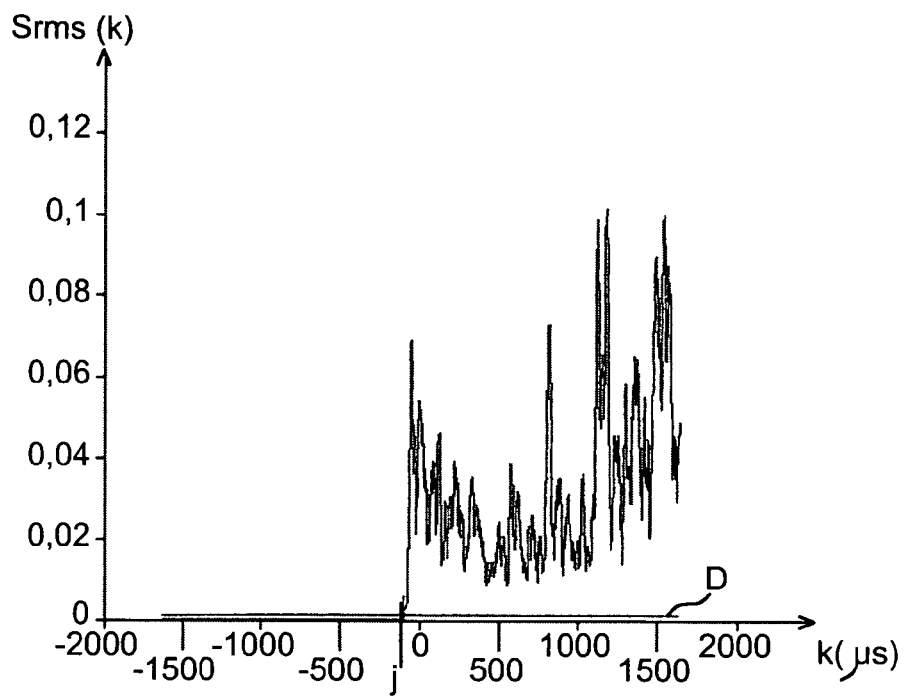
Figure 6C:
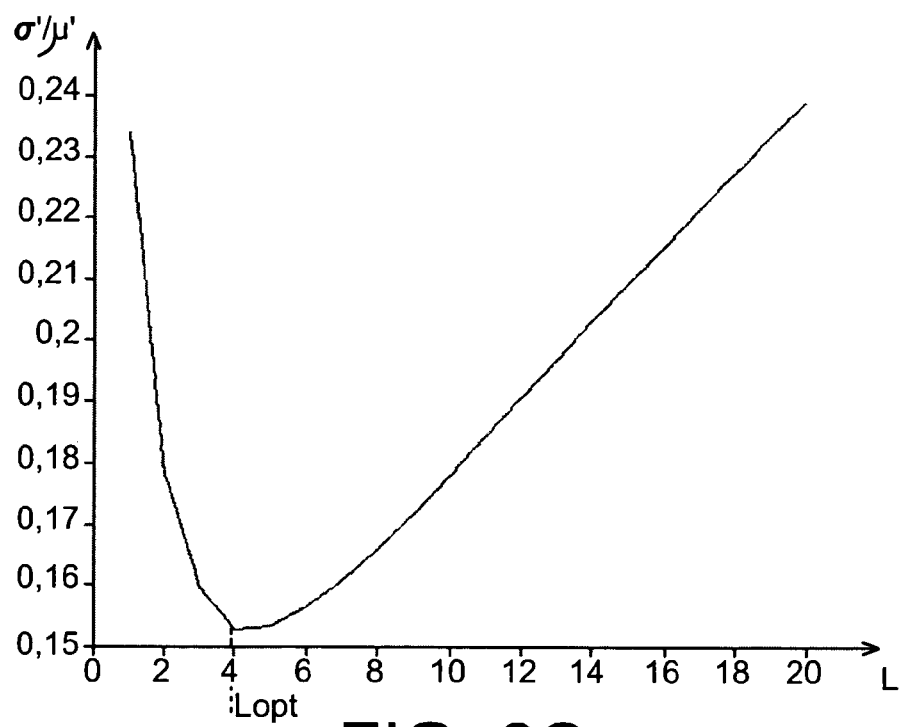
FIGS. 6C, 6D show the ratio of the standard deviation to the average of the partial energy of the signal in FIGS. 2A and 2B respectively.
Figure 6D:
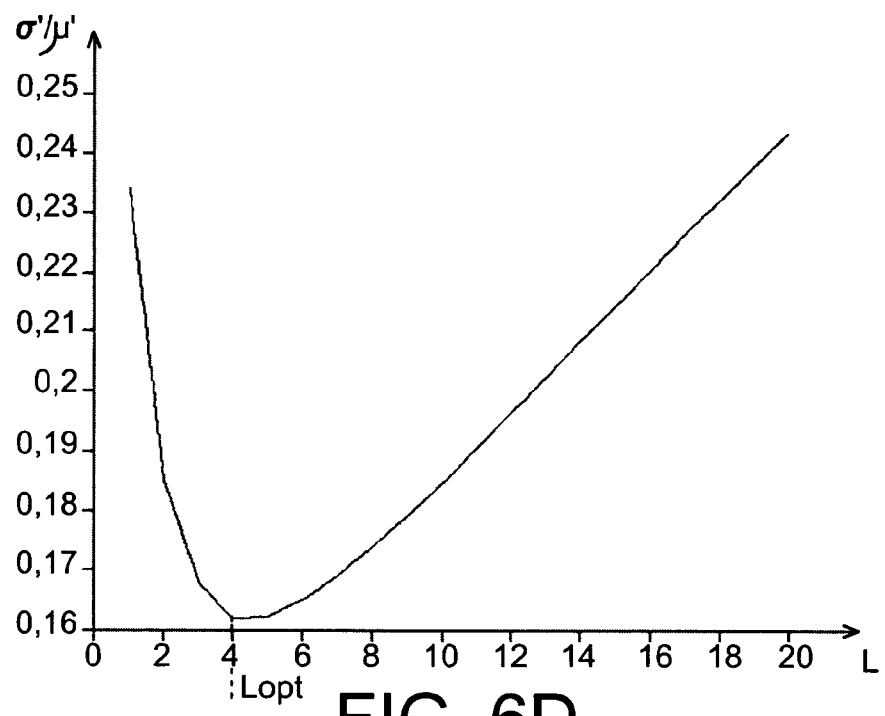
Figure 7:
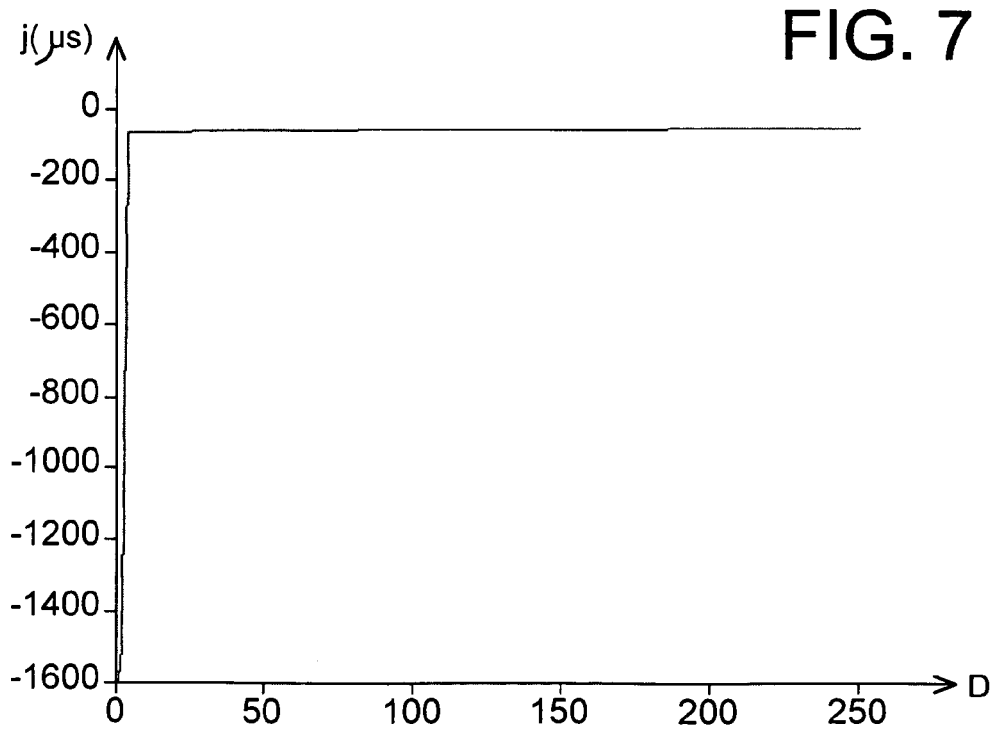
FIG. 7 illustrates the variation in the position of the wave front as a function of the threshold D obtained from the signals in FIG. 1A.

Lopt is equal to 6 in FIG. 5A, 7 in FIG. 5B, 4 in FIG. 6C and Lopt is equal to 4 in FIG. 6D.

This optimum value Lopt of the width of the window will be used to search for the position j of the first sample that exceeds the threshold D by applying the formula (1).

We will now see how to precisely determine the optimum width P of the range of the first samples located on the upstream side of the wave front F.

Smoothing of the partial energy of the signal Srms (k)' limited to the first P values of the signal y(k) can cause detection of an imprecise or even incorrect position of the wave front F if the characteristics of the signal y(k) vary considerably between the rank P sample and the wave front F. It is preferable to refine detection to avoid this, by detecting an approximate position jc for the wave front F and fixing the optimum width P of the range of the first samples at a fraction u, less than one, of the approximate position jc.

The approximate position jc for the wave front F is the first position for which Srms(jc)>q|maxSrms(k)'| where k is within the set {1, P'}, q is a number less than one and P' is an approximate width of the range of the first samples, q and P' are fixed by the user by experience, q is typically between 2 and 10 and P' is typically between 200 and 5000. In the examples described in FIGS. 4A, 4B q is equal to 7 and P' is equal to 2000.

It is assumed that FIGS. 4A and 4B show this approximate position jc of the wave front F, the energy of the signal Srms (k) being represented during a first search for this position (called the first pass). Starting from the approximate position jc of the wave front F, the optimum width P of the range of the first values of the signal can be calculated such that P=u.jc. One advantageous value of u is obtained by choosing u=0.9. The position j of the wave front F on the optimum range of P samples can be calculated by applying formula (1), obviously recalculating the optimum width Lopt of the window.

It is assumed that FIGS. 6C and 6D illustrate the calculation of the optimum width Lopt of the window during a second pass and that FIGS. 6A and 6B illustrate the calculation of the position of the wave front j, also during the second pass. The optimum width Lopt is equal to 4 in both cases.

The energy of the signal on the upstream side of the wave front was smoothed better and the position j of the wave front F is determined more precisely than during the first pass.

FIG. 7 shows the variation of the position j of the wave front F as a function of the threshold D. This variation has a knee level. The threshold D (identified by the vertical straight line) used is close to this knee level of the curve that confirms that the threshold was well chosen.

We will now illustrate the shape of a particular acoustic signal with a wave front received by five different detectors denoted Ch2 to Ch6, with reference to FIGS. 8A to 8E. FIG. 8F is a table that gives the position of the wave front detected visually or using the method according to the invention, for each of the detectors Ch2 to Ch6. Obviously, the values obtained by the calculation depend on the choice of the threshold D and this choice depends on the user experience. It is found that there is a good correlation between positions detected visually and positions obtained by the method.

The position j of the wave front F thus determined that represents the time at which the wave front F was received by the detector, can be used to determine the time elapsed between when the wave front is emitted and when it is received by the detector; in other words the time delay between when the wave front is emitted and when it is received by the detector. This time delay corresponds to the response time of the detector. The said detector and a reference detector are then necessary. The position of the wave front of the same signal that they receive can be determined for each. One of them is considered to be the reference detector. All that is necessary then is to make a simple subtraction between the two detected positions, this difference being representative of the time elapsed between when the wave front was emitted and when it was received by the detector. In practice, each detector will be used in turn as the reference detector.

This invention also relates to a method for determining the position of a partial discharge source S in an electrical equipment 2, for example such as a power transformer. Refer to FIG. 9. This partial discharge source S emits an acoustic signal beginning with a wave front that can be detected by the method that has just been described.

A particularly simple method to detect the position of a partial discharge source S in the electrical equipment 1 located in a containment 2 containing an acoustically conducting fluid can consist of positioning at least four detectors 5.1, 5.2, 5.3, 5.4 in contact with the outside of the containment 2 of the electrical equipment 1.

The acoustic detectors 5.1, 5.2, 5.3, 5.4 are electrically connected firstly to power supply means 7.1 and secondly to acquisition and processing means 7.2, for the signals output by them.

These signal processing means 7.2 include filter means and analogue digital conversion means. Reference 6 illustrates calculation means such as a computer or a calculator.

They receive signals output by detectors after processing. References 3 and 4 illustrate high voltage crossings and low voltage crossings respectively passing through containment 1 of the transformer.

The coordinates of these four detectors are acquired and are expressed as (xi, yi, zi) for detector 5.1, (xj, yj, zj) for detector 5.2, (xk, yk, zk) and for detector 5.3, and (xl, yl, zl) for detector 5.4, in an orthonormal coordinate system, for example related to containment 2. One of the corners of the containment 2 and three of its edges intersecting at this corner could be used if the containment 2 is parallelepiped-shaped. The coordinates of the partial discharge source S seen from the quadruplet of detectors are denoted x, y, z, which are unknowns.

We will then solve the system of equations with three unknowns x, y, z given below, by optimization:

$$\sqrt{(x-xj)^2+(y-yj)^2+(z-zj)^2} - \sqrt{(x-xi)^2+(y-yi)^2+(z-zi)^2} - v(tj-ti) = 0$$

$$\sqrt{(x-xk)^2+(y-yk)^2+(z-zk)^2} - \sqrt{(x-xi)^2+(y-yi)^2+(z-zi)^2} - v(tk-ti) = 0$$

$$\sqrt{(x-xl)^2+(y-yl)^2+(z-zl)^2} - \sqrt{(x-xi)^2+(y-yi)^2+(z-zi)^2} - v(tl-ti) = 0$$

where ti, tj, tk, tl represent the reception times of the acoustic wave emitted by the partial discharge by each acoustic detector 5.1, 5.2, 5.3, 5.4. These reception times correspond to the positions of the wave front determined by the method described above.

It is then checked if the coordinates x, y, z found are actually located inside the containment 2 for which the dimensions are known. If they are not, the position found is eliminated. If there are only four detectors, then they will have to be repositioned and the procedure restarted.

If there are more than four acoustic detectors, the same calculation can be restarted by choosing at least one other quadruplet of detectors, until all quadruplets have been used. The position of the partial discharge source S can be determined by calculating an average of all positions determined with each quadruplets.

This method of determining the position of the partial discharge is known as the R. BUCHER method, which is a conventional triangulation method.

A more sophisticated method can be used so as to improve the positioning precision. This method was described in French patent application No. 04 50729 deposited on Apr. 13, 2004 by the Applicant.

Several acoustic detectors 5.1 to 5.x are used, as in the previous case. There are at least three detectors in one variant and at least four in another variant. They are placed outside the containment 2 as shown in the previous case. Y groups of acoustic detectors are defined among X acoustic detectors, where $$Y=Z!/3!(Z-3)!,$$

each group comprising at least three detectors, Z being equal to X or X-1.

A first verification is made to assure that each group does not contain a triangle for which the vertices are materialized by three acoustic detectors and that comprises at least one angle outside a predetermined range of angles. If there is such a triangle in the group, the group is eliminated. The range of angles may be between 30° and 151° inclusive.

For each group not eliminated after the first verification, an approximate position of the partial discharge source S is calculated starting from the position of acoustic detectors in the group and the reception time of the acoustic wave emitted by the partial discharge source, by each detector in the group. These reception times are materialized by positions determined by the method described above and are denoted t1 to tx.

A second verification is made for each group not eliminated after the first verification, to assure that each group does not contain a triangle for which the vertices are materialized by two acoustic detectors and the position of the partial discharge source S seen by the group, that comprises at least one angle outside the predetermined range. If there is such a triangle in the group, the group is eliminated. The required position of the partial discharge source S is calculated by taking the average of the calculated positions for all or some of the groups not eliminated after the second verification.

Obviously, as with the method described above, the dimensions of the containment 2 are acquired. An additional verification is carried out to determine whether or not the position of the partial discharge source S calculated for each group not eliminated after the second verification is within the containment 2 of the equipment 1, and if it is not the group is eliminated.

If Z=X−1, the group of detectors is a quadruplet including an acoustic detector acting as a time reference. The positions of the discharge source seen from the group are calculated by optimization, solving the same system of equations as in the R. Bucher method.

$$\sqrt{(x-xj)^2+(y-yj)^2+(z-zj)^2} - \sqrt{(x-xi)^2+(y-yi)^2+(z-zi)^2} - v(tj-ti) = 0$$

$$\sqrt{(x-xk)^2+(y-yk)^2+(z-zk)^2} - \sqrt{(x-xi)^2+(y-yi)^2+(z-zi)^2} - v(tk-ti) = 0$$

$$\sqrt{(x-xl)^2+(y-yl)^2+(z-zl)^2} - \sqrt{(x-xi)^2+(y-yi)^2+(z-zi)^2} - v(tl-ti) = 0$$

in which x, y, z represent the position of the partial discharge source S seen from the group of detectors, (xi, yi, zi), (xj, yj, zj), (xk, yk, zk), (xl, yl, zl) represent the position of the four acoustic detectors of the quadruplet, ti, tj, tk, tl the reception times of the acoustic wave emitted by the partial discharge by each acoustic detector in the quadruplet, and v is the velocity of the acoustic wave in the fluid. Reception times are materialized by the positions determined for each detector using the method described above.

If Z=X, the group of detectors is a triplet. The position seen by the group is calculated by triangulation, by solving the following system of equations:

$$(x-xi)^2+(y-yi)^2+(z-zi)^2 - v^2(ti-t0)^2 = 0$$

$$(x-xj)^2+(y-yj)^2+(z-zj)^2 - v^2(tj-t0)^2 = 0$$

$$(x-xk)^2+(y-yk)^2+(z-zk)^2 - v^2(tk-t0)^2 = 0 \text{ in}$$

which x, y, z represent the position seen by the group of detectors in the partial discharge source S, (xi, yi, zi), (xj, yj, zj), (xk, yk, zk) represent the position of the acoustic detectors of the triplet, t0 is an emission time of a partial discharge generated by the partial discharge source 2, ti, tj, tk are the reception times of the acoustic wave emitted by the partial discharge by each acoustic detector in the triplet, and v is the velocity of the acoustic wave in the fluid. Times ti, tj, tk are materialized by positions determined using the method for determination of the position of a wave front as described above.

The emission time t0 of the partial discharge can be measured by electrical means 8 such as an antenna type detector that cooperate with the containment 1. These electrical means are not useful in the embodiments described above because acoustic detector quadruplets are used.

In this embodiment, the electrical means 8 detect a high frequency or ultra high frequency wave emitted by the partial discharge source S. Such an antenna type detector is described in French patent application FR-A-2 851 852 deposited by ALSTOM on Feb. 27, 2003. The antenna type detector 8 is placed in a housing 10 added onto the containment 1. This housing 10 is located at a drain valve usually provided near the bottom of the containment 1 so that the dielectric fluid can be drained or that tests can be made.

Reference 9 describes means of processing the signal output from the antenna type detector 8. After processing, signals output from the antenna type detector 8 are injected into calculation means 6 because they are used as signals output from detectors 5.1, 5.2, 5.3, 5.4 for calculating the position of the partial discharge source S.

Although several embodiments of this invention have been described and discussed in detail, it can easily be understood that various changes and modifications can be made without departing from the scope of the invention.

DOCUMENTS MENTIONED

[1] Nikias C. L. and Mendel J. M., Signal processing with higher-order spectra", IEEE Signal processing Magazine, vol. 1, No. 3, pp. 10-37, July 1993.
[2] Nikias C. L. and Petropuly A., "Higher-Order Spectra Analysis: A Nonlinear Signal Processing Framework", New Jersey: Prentice-Hall, 1993.
[3] Mendel J. M., "Tutorial on higher-order statistics (spectra) in signal processing and system theory: Theoretical results and some applications", Proc. IEEE, vol. 79, pp. 278-305, 1991.
[4] Nikias C. L. and Pan R., "Time delay estimation in unknown Gaussian spatially correlated noise", IEEE Trans. Acoust., Speech, Signal Processing, vol. 36, pp. 1706-14, Nov. 1988.
[5] Chiang H. H. and Nikias C. L., "A new method for adaptive time delay estimation for non-gaussian signals", IEEE Trans. Acousti., Signal Processing, vol. 38, No. 2, February 1990.
[6] Swami A. and Mendel J. M., "Cumulant-based approach to the harmonic retrieval and related problems", IEEE Trans. Acoust., Speech, Signal Processing, vol. 39, pp. 1099-1109, May 1991.
[7] Phung, James, Blackburn, Su: "Partial discharge ultrasonic Wave Propagation in Steel Transformer Tanks", 7th International Symposium on High Voltage Engineering, Tecknische Universitat Dresden, Aug. 26-30, 1991, pp. 131-134.

The invention claimed is:
1. Method for detection of a position of a wave front (F) in a signal received by a detector, comprising:
converting the signal into a digital signal,
defining a working group containing a number (N) of successive samples in the digital signal,
calculating the energy of the signal from the samples in the working group in terms of the root mean square over a sliding window, the window comprising an optimum number of samples (Lopt) (Lopt is less than the number (N) of samples,
detecting the position of the wave front corresponding to the position of the sample for which the energy of the signal exceeds a threshold (D) that depends on the value of the energy of the signal previously at the wave front, for the first time, and providing a signal indicating the detected position of the wave front.

2. Method according to claim 1, further comprising determining the optimum number of samples (Lopt) of the window by:

choosing an arbitrary number (L') of samples, calculating the partial energy of the signal in terms of the root mean square within a range of the first P samples in the working group, the sliding window containing said arbitrary number (L') of samples, calculating the average of the partial energy of the signal in terms of the root mean square within the range of the first P samples, calculating the standard deviation of the partial energy of the signal in terms of the root mean square within the range of the first P samples, calculating the ratio of the average to the standard deviation, the optimum number (Lopt) of samples in the sliding window corresponding to the minimum of this ratios, or the maximum of this ratio.

3. Method according to either claim 1 or 2 in which the threshold (D) is a multiple (r) of the standard deviation ($\sigma$) plus the average ($\mu$) in the range of the first P samples.

4. Method according to claim 1, in which the definition of the working group (G) consists of removing a subgroup (z3) of successive samples considered as being saturated, from a group of samples obtained by the analogue digital conversion.

5. Method according to claim 4, in which a first sample x(k) of the subgroup is considered as being saturated if this sample x(k) and the subsequent three samples x(k+1), x(k+2), x(k+3) satisfy the following relations:

|x(k)−x(k+1)|>$\epsilon$ and |x(k+1)−x(k+2)|>$\epsilon$ and |x(k+2)−x(k+3)|>$\epsilon$ and |x(k)|>$\theta$ where $\epsilon$ is the first floor and $\theta$ is the second floor, the subgroup comprising all samples in the group of samples obtained by the analogue conversion following the first sample considered as being saturated.

6. Method according to claim 5, in which the first floor $\epsilon$ is equal to $10^{-6}$V and the second floor $\theta$ is equal to 1V.

7. Method according to claim 1, in which the processing consists of filtering the samples so as to eliminate firstly a DC component and secondly to amplify samples at the highest frequencies.

8. Method according to claim 7, in which the filtering is a derivation.

9. Method according to claim 1, in which the number P of samples in the range is fixed equal to a fraction (u) of the position (jc) of a first sample for which the energy of the signal in the root mean square form is greater than a multiple (q) of the maximum energy of the signal in root mean square form over a range of an approximate number P' of first samples of the signal, where q and P' are chosen arbitrarily.

10. Method according to claim 9, in which the fraction u is chosen so as to be equal to 0.9.

11. Method for determining the response time of at least one detector exposed to a signal comprising a wave front, the method comprising:

detecting the wave front of the signal received by the detector according to the method for detecting a wave front in claim 1; and comparing the position detected at the detector with the position detected by the same method at another reference detector.

12. Method for detection and positioning of a partial discharge source in an electrical equipment placed in a containment containing an acoustically conducting fluid, the method comprising:

arranging several acoustic detectors in contact with the outside of the containment and acquiring their positions, forming one or several groups of detectors, these groups being triplets or quadruplets, or each detector in at least some of the groups, detecting the position of a front of an acoustic wave emitted by the partial discharge source using the method defined in claim 1, this position being representative of the reception time of the acoustic wave emitted by the partial discharge source by each detector;

for at least some groups, calculating the position of the partial discharge source seen by these groups starting from the position of the acoustic detectors and the reception time of the acoustic wave emitted by the partial discharge source, by each detector.

13. Method according to claim 12, in which the position of the partial discharge source seen from a group consisting of a triplet is calculated by optimization by solving the following system of equations:

$$(x-xi)^2+(y-yi)^2+(z-zi)^2-v^2(ti-t0)^2=0$$

$$(x-xj)^2+(y-yj)^2+(z-zj)^2-v^2(tj-t0)^2=0$$

$$(x+xk)^2+(y+yk)^2+(z-zk)^2-v^2(tk-t0)^2=0$$

in which x, y, z denote the position of the partial discharge source, (xi, yi, zi), (xi, yj, zj), (xk, yk, zk) denote the position of the acoustic detectors of the triplet, t0 denotes an emission time of a partial discharge generated by the partial discharge source and ti, tj, tk are the reception times of the acoustic wave emitted by the partial discharge by each acoustic detector in the triplet, and v is the velocity of the acoustic wave in the fluid.

14. Method according to claim 13, in which the emission time t0 of the partial discharge is measured by electrical means such as an antenna type electrical detector that cooperates with the containment.

15. Method according to claim 12, in which the position of the partial discharge source seen from a group formed from a quadruplet is calculated by triangulation, by solving the following system of equations:

$$\sqrt{(x-xj)^2+(y-yj)^2+(z-zj)^2}-\sqrt{(x-xi)^2+(y-yi)^2+(z-zi)^2}-v(tj-ti)=0$$

$$\sqrt{(x-xk)^2+(y-yk)^2+(z-zk)^2}-\sqrt{(x-xi)^2+(y-yi)^2+(z-zi)^2}-v(tk-ti)=0$$

$$\sqrt{(x-xl)^2+(y-yl)^2+(z-zl)^2}-\sqrt{(x-xi)^2+(y-yi)^2+(z-zi)^2}-v(tl-ti)=0$$

in which x, y, z represent the position of the partial discharge source, (xi, yi, zi), (xi, yj, zj), (xk, yk, zk), (xl, yl, zl) represent the position of the four acoustic detectors in the quadruplet, ti, tj, tk, tl are the reception times of the acoustic wave emitted by the partial discharge for each acoustic detector in the quadruplet, and v is the velocity of the acoustic wave in the fluid.

16. Method according to claim 12, in which it is verified that the position found for the partial discharge source seen by a group is located inside the containment, otherwise said position is eliminated.

17. Method according to claim 12, in which a first verification is made before the calculation to assure that each group does not contain a triangle for which the vertices are materialized by three acoustic detectors, comprising at least one angle outside a predetermined range of angles, and if there is such a triangle in the group, the group does not participate in the calculation.

18. Method according to claim 17, in which a second verification is made after the calculation to assure that each group not eliminated after the first verification does not contain a triangle for which the vertices are materialized by two of the detectors in the group and the position of the partial discharge source seen by the group, comprising at least one angle outside the predetermined range, and if there is such a triangle in the group, the group is eliminated.

19. Method according to claim 17, in which the range of angles varies between 30° and 151° inclusive.

20. Method according to claim 12, in which when several positions are obtained as seen from several groups that have not been eliminated and these positions are located within the containment, an average of the positions of the partial discharge source calculated for each of the non-eliminated groups is calculated.

21. Method according to claim 1, wherein the samples of the working group are processed and the calculating step of the energy of the signal is done from the processed sample.

* * * * *